(12) United States Patent
Bryant et al.

(10) Patent No.: US 7,038,358 B2
(45) Date of Patent: May 2, 2006

(54) ELECTRO-ACTIVE TRANSDUCER USING RADIAL ELECTRIC FIELD TO PRODUCE/SENSE OUT-OF-PLANE TRANSDUCER MOTION

(75) Inventors: Robert G. Bryant, Lightfoot, VA (US); Robert L. Fox, Hayes, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 312 days.

(21) Appl. No.: 10/347,563

(22) Filed: Jan. 16, 2003

(65) Prior Publication Data

US 2003/0173872 A1 Sep. 18, 2003

Related U.S. Application Data (60) Provisional application No. 60/364,652, filed on Mar. 15, 2002.

(51) Int. Cl.
*H01L 41/047* (2006.01)

(52) U.S. Cl. .................. 310/365; 310/344; 310/368; 310/369

(58) Field of Classification Search ............. 310/320, 310/324, 333, 344, 348, 365, 368, 369
See application file for complete search history.

(56) References Cited

U.S. PATENT DOCUMENTS

| | | | |
|---|---|---|---|
| 2,540,187 A | 2/1951 | Cherry, Jr. | |
| 2,540,194 A | 2/1951 | Ellett | |
| 2,836,737 A | 5/1958 | Crownover | |
| 2,836,738 A | 5/1958 | Crownover | 310/331 |
| 2,967,956 A | 1/1961 | Dranetz et al. | 310/330 |
| 3,114,849 A | 12/1963 | Poschenrieder | |
| 3,457,543 A | 7/1969 | Akervold et al. | 367/155 |
| 3,510,698 A | 5/1970 | Massa | 310/335 |

(Continued)

FOREIGN PATENT DOCUMENTS

| | | |
|---|---|---|
| DE | 1165667 B | 3/1964 |
| EP | 0534389 A | 3/1993 |
| JP | 54-138392 | * 10/1979 |
| JP | 02-174499 | * 7/1990 |

OTHER PUBLICATIONS

Hari Singh Nalwa, "Ferroelectric Polymers; Chemistry, Physics, and Applications," Marcel Dekker, Inc., p. 710–711,.

(Continued)

*Primary Examiner*—Thomas M. Dougherty
(74) *Attorney, Agent, or Firm*—Helen M. Galus (57) ABSTRACT

An electro-active transducer includes a ferroelectric material sandwiched by first and second electrode patterns. When the device is used as an actuator, the first and second electrode patterns are configured to introduce an electric field into the ferroelectric material when voltage is applied to the electrode patterns. When the device is used as a sensor, the first and second electrode patterns are configured to introduce an electric field into the ferroelectric material when the ferroelectric material experiences deflection in a direction substantially perpendicular thereto. In each case, the electrode patterns are designed to cause the electric field to: i) originate at a region of the ferroelectric material between the first and second electrode patterns, and ii) extend radially outward from the region of the ferroelectric material (at which the electric field originates) and substantially parallel to the ferroelectric material's plane.

34 Claims, 7 Drawing Sheets

U.S. PATENT DOCUMENTS

| | | | | |
|---|---|---|---|---|
| 4,051,455 | A | | 9/1977 | Fowler ....................... 310/337 |
| 4,284,921 | A | | 8/1981 | Lemonon et al. ........... 310/322 |
| 4,401,911 | A | | 8/1983 | Ravinet et al. ............. 380/190 |
| 4,409,681 | A | | 10/1983 | White ........................ 367/166 |
| 4,439,706 | A | * | 3/1984 | Matsuoka et al. .......... 310/353 |
| 4,452,084 | A | | 6/1984 | Taenzer ....................... 30/334 |
| 4,581,556 | A | | 4/1986 | Yamamoto |
| 5,081,995 | A | | 1/1992 | Lu et al. ..................... 600/459 |
| 5,122,993 | A | | 6/1992 | Hikita et al. ................ 367/155 |
| 5,262,696 | A | * | 11/1993 | Culp ........................... 310/328 |
| 5,291,090 | A | | 3/1994 | Dias ........................... 310/334 |
| 5,327,041 | A | | 7/1994 | Culp |
| 5,503,034 | A | | 4/1996 | Amano et al. ......... 73/862.473 |
| 5,552,655 | A | * | 9/1996 | Stokes et al. ............... 310/330 |
| 5,592,042 | A | | 1/1997 | Takuchi et al. |
| 5,663,505 | A | | 9/1997 | Nakamura ................... 73/702 |
| 5,862,275 | A | | 1/1999 | Takeuchi et al. |
| 6,072,267 | A | | 6/2000 | Atsuta |
| 6,091,182 | A | | 7/2000 | Takeuchi et al. ............ 310/330 |
| 6,297,578 | B1 | | 10/2001 | Takeuchi et al. ............ 310/330 |
| 6,323,580 | B1 | | 11/2001 | Bernstein |
| 6,351,196 | B1 | | 2/2002 | Nakamura et al. .......... 333/195 |

OTHER PUBLICATIONS

Shinichi Sakai et al, Presented at the 78th Convention of the Audio Engineering Society, "Digital–to–analog Conversion by Piezoelectric Headphone," AES, p. 1–18, (May 3, 1985).

R. G. Bryant et al, Proceedings, Actuator 2002, Paper A1.3, "Radial Field Piezoelectric Diaphragms," 6 pages, (Jun. 10, 2002).

R. G. Bryant et al, Presented at the First World Congress on Biomimetics and Artificial Muscles, Albuquerque, NM, "The Effect of Radial Electric Fields on Piezoceramics and the Application of these Devices," 6 pages, (Dec. 9, 2002).

* cited by examiner

ELECTRO-ACTIVE TRANSDUCER USING RADIAL ELECTRIC FIELD TO PRODUCE/ SENSE OUT-OF-PLANE TRANSDUCER MOTION

ORIGIN OF THE INVENTION

The invention described herein was made by employees of the United States Government and may be manufactured and used by or for the Government for governmental purposes without the payment of any royalties thereon or therefor. Pursuant to 35 U.S.C. § 119, the benefit of priority from provisional application No. 60/364,652, with a filing date of Mar. 15, 2002, is claimed for this non-provisional application.

BACKGROUND OF THE INVENTION

1. Field of the Invention

This invention relates to electro-active transducers. More specifically, the invention is an electro-active transducer that generates out-of-plane motion when a radial electric field is induced in the plane of the transducer, or that converts applied out-of-plane motion into a radial electric field in the plane of the transducer.

2. Description of the Related Art

Solid-state transducers generally make use of electro-active materials. In the case of an actuator, the electro-active material generates physical displacement in response to an applied voltage. In one embodiment, these actuators are planar and have one or more pieces of ferroelectric material (e.g., piezoelectric, piezostrictive, pyroelectric, etc.) with one or more electrodes coupled thereto. The plane of the actuator is typically referenced as the "X-Y" plane with the "Z" direction being perpendicular thereto. In terms of an actuator, with the electrodes lying in the X-Y plane, the electric field (induced when voltage is applied to the electrodes) will also lie in the X-Y plane. Displacement of such actuators will also occur in the X-Y plane. Thus, in terms of the device's piezoelectric charge constant, these devices are said to be "$d_{11}$", "$d_{21}$", "$d_{12}$", or "$d_{22}$" where the first subscript refers to the direction of applied field strength and the second subscript refers to the direction of measured induced strain. The numbers 1, 2, and 3 correspond to the X, Y, and Z directions, respectively. To summarize, the induced electric field and corresponding displacement are essentially co-planar for such solid-state planar-types of actuators. The opposite would be true in terms of planar-types of sensors. That is, in-plane displacement would generate an in-plane electric field indicative of the force creating the in-plane displacement.

Transducers may also function in a situation where out-of-plane displacement (i.e., in the Z direction) is caused by the application of an electric field in the X-Y plane. In such situations, the transducer behaves as a "$d_{13}$" or "$d_{23}$" device.

SUMMARY OF THE INVENTION

In accordance with the present invention, an electro-active transducer includes at least one piece of ferroelectric material defining a first surface and a second surface opposing the first surface. The first and second surfaces lie in substantially parallel planes. A first electrode pattern is coupled to the first surface and a second electrode pattern is coupled to the second surface. When used as an actuator, the first and second electrode patterns are configured to introduce an electric field into the ferroelectric material when voltage is applied to the electrode patterns. The electrode patterns are designed to cause the electric field to: i) originate at a region of the ferroelectric material between the first and second electrode patterns, and ii) extend radially outward from the region of the ferroelectric material (at which the electric field originates) and substantially parallel to the parallel planes defined by the ferroelectric material. As a result, the ferroelectric material deflects symmetrically about the region of the ferroelectric material at which the electric field originates. In other words, the ferroelectric material deflects in a radially symmetric fashion and in a direction that is substantially perpendicular to the electric field.

When used as a sensor, the first and second electrode patterns are configured to produce an induced electric field in the ferroelectric material when the ferroelectric material experiences deflection in a direction substantially perpendicular to the first and second surfaces. The induced electric field originates at the region of the ferroelectric material between the first and second electrode patterns, and extends radially outward from the region substantially parallel to the first and second surfaces. As a result, a current is induced in each of the first and second electrode patterns with the current being indicative of the deflection.

DETAILED DESCRIPTION OF THE INVENTION

Figure 1:
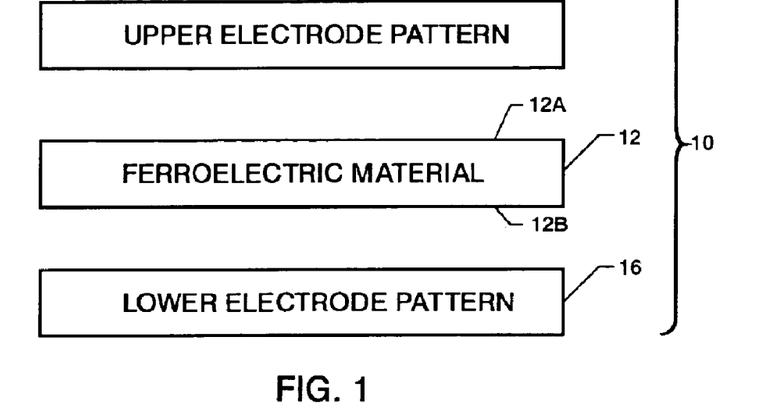
FIG. 1 is a schematic view of an electro-active transducer according to the present invention.

Referring now to the drawings, and more particularly to FIG. 1, a top-level schematic drawing of the electro-active transducer of the present invention is shown and referenced generally by numeral 10. By way of illustrative example, transducer 10 will be described for its use as an actuator. However, it is to be understood that transducer 10 can be operated as an actuator (i.e., voltage applied to generate an electric field that results in Z-axis displacement) or a sensor (i.e., environment-caused Z-axis displacement generating an electric field that is indicative of a voltage).

The essential elements of transducer 10 are a ferroelectric material 12 sandwiched between an upper electrode pattern 14 and a lower electrode pattern 16. More specifically, electrode patterns 14 and 16 are coupled to ferroelectric material 12 such that voltage applied to the electrode patterns is coupled to ferroelectric material 12 to generate an electric field as will be explained further below. Such coupling to ferroelectric material 12 can be achieved in any of a variety of well known ways. For example, electrode patterns 14 and 16 could be applied directly to opposing surfaces of ferroelectric material 12 by means of vapor deposition, printing, plating, or gluing, the choice of which is not a limitation of the present invention.

Ferroelectric material 12 is any piezoelectric, piezorestrictive, electrostrictive (such as lead magnesium niobate lead titanate (PMN-PT)), pyroelectric, etc., material structure that deforms when exposed to an electrical field (or generates an electrical field in response to deformation as in the case of an electro-active sensor). One class of ferroelectric materials that has performed well in tests of the present invention is a ceramic piezoelectric material known as lead zirconate titanate, which has sufficient stiffness such that transducer 10 maintains a symmetric, out-of-plane displacement as will be described further below.

Figure 2:
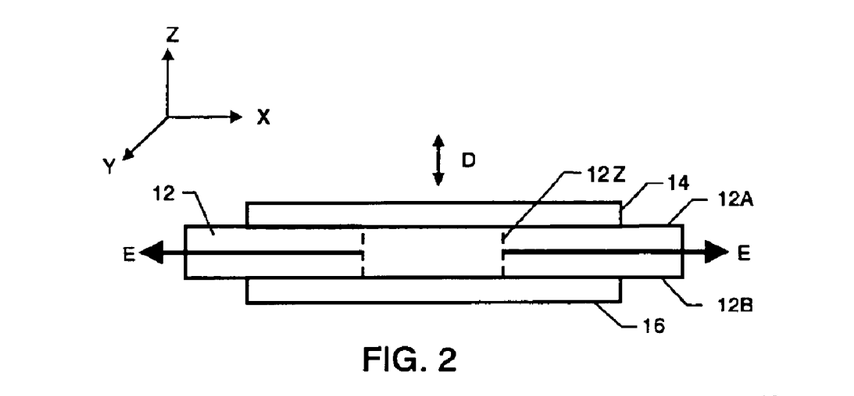
FIG. 2 is a side, schematic view of the electro-active transducer shown in FIG. 1 illustrating the radial electric field and out-of-plane displacement generated thereby.
Figure 3:
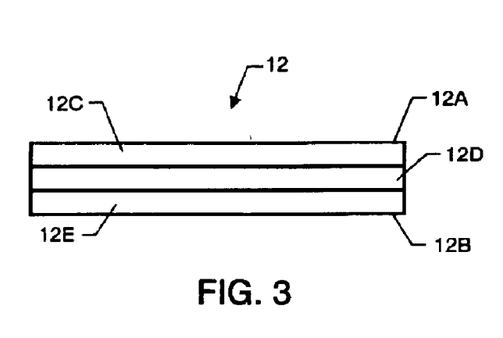
FIG. 3 is a side view of a layered construction of the transducer's ferroelectric material.
Figure 4:
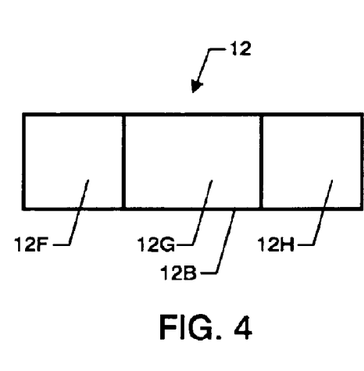
FIG. 4 is a side view of a piece-wise construction of the transducer's ferroelectric material.

Ferroelectric material 12 is typically a composite material where the term "composite" as used herein can mean one or more materials mixed together (with at least one of the materials being ferroelectric) and formed as a single sheet or monolithic slab with major opposing surfaces 12A and 12B lying in substantially parallel planes as best illustrated in the side view shown in FIG. 2. However, the term "composite" as used herein is also indicative of: i) a ferroelectric laminate made of multiple ferroelectric material layers such as layers 12C, 12D, 12E (FIG. 3) or ii) multiple ferroelectric pieces bonded together such as pieces 12F, 12G, 12H (FIG. 4). Note that in each case, major opposing surfaces 12A and 12B are defined for ferroelectric material 12.

In general, upper electrode pattern 14 is aligned with lower electrode pattern 16 such that, when voltages are applied thereto, a radial electric field E is generated in ferroelectric material 12 in a plane that is substantially parallel to the parallel planes defined by surfaces 12A and 12B, i.e., in the X-Y plane. More specifically, electrode patterns 14 and 16 are aligned on either side of ferroelectric material 12 such that the electric field E originates and extends radially outward in the X-Y plane from a region 12Z of ferroelectric material 12. The size and shape of region 12Z is determined by electrode patterns 14 and 16, a variety of which will be described further below.

The symmetric, radially-distributed electric field E mechanically strains ferroelectric material 12 along the Z-axis (perpendicular to the applied electric field E). This result is surprising and contrary to related art electro-active transducer teachings and devices. That is, it has been well-accepted in the transducer art that out-of-plane (i.e., Z-axis) displacement required an asymmetric electric field through the thickness of the active material. The asymmetric electric field introduces a global asymmetrical strain gradient in the material that, upon electrode polarity reversal, counters the inherent induced polarity through only part of the active material to create an in-situ bimorph. This result had been achieved by having electrodes on one side of the ferroelectric material. However, tests of the present invention have shown that displacement is substantially increased by using electrode patterns 14 and 16 that are aligned on both sides of ferroelectric material 12 such that the symmetric electric field E originates and extends both radially outward from region 12Z and throughout the thickness of the ferroelectric material.

Figure 5:
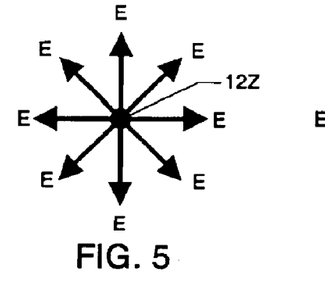
FIG. 5 is a diagrammatic view of a radial electric field originating from a point in the X-Y plane of the transducer's ferroelectric material.
Figure 6:
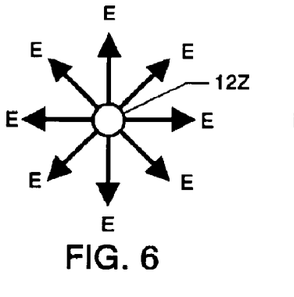
FIG. 6 is a diagrammatic view of a radial electric field originating from the periphery of a circle in the X-Y plane of the transducer's ferroelectric material.
Figure 7:
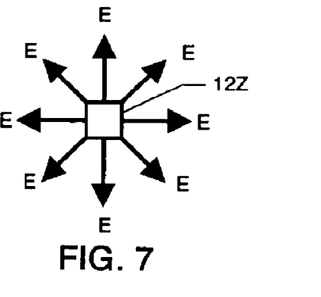
FIG. 7 is a diagrammatic view of a radial electric field originating from the periphery of a square in the X-Y plane of the transducer's ferroelectric material.

Electrode patterns 14 and 16 can define a variety of shapes (i.e., viewed across the X-Y plane) of region 12Z without departing from the scope of the present invention. For example, as shown in FIG. 5, region 12Z could be a point with radial electric field E extending radially outward therefrom. The periphery of region 12Z could also be a circle (FIG. 6) or a square (FIG. 7) with radial electric field E extending radially outward therefrom. Other X-Y plane shapes (e.g., triangles, pentagons, hexagons, etc.) of region 12Z could also be defined without departing from the scope of the present invention.

In accordance with the present invention, radially-extending electric field E lies in the X-Y plane while displacement D occurs in the Z direction substantially perpendicular to surfaces 12A and 12B. Depending on how electric field E is applied, displacement D can be up or down along either the positive or negative Z-axis, but does not typically cross the X-Y plane for a given electric field. The amount of displacement D is greatest at the periphery of region 12Z where radial electric field E originates. The amount of displacement D decreases with radial distance from region 12Z with deflection of ferroelectric material 12 being symmetric about region 12Z. That is, ferroelectric material 12 deflects in a radially symmetric fashion and in a direction that is substantially perpendicular to surfaces 12A and 12B.

As mentioned above, a variety of electrode patterns can be used to achieve the out-of-plane or Z-axis displacement in the present invention. A variety of non-limiting electrode patterns and resulting local electric fields generated thereby will now be described with the aid of FIGS. 8–15 where the "A" figure depicts an upper electrode pattern 14 as viewed from above same, the "B" figure depicts the corresponding lower electrode pattern as viewed from below same, and the "C" figure is a cross-sectional view of the ferroelectric material with the upper and lower electrode patterns coupled thereto and further depicts the resulting local electric fields generated by application of a voltage to the particular electrode patterns.

Figure 8A:
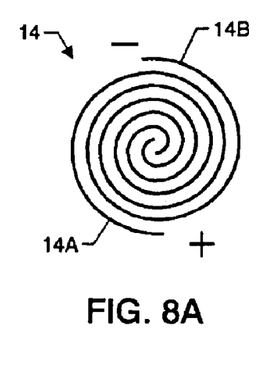
FIG. 8A is an isolated view of an upper electrode pattern using circular intercirculating electrodes.
Figure 8B:
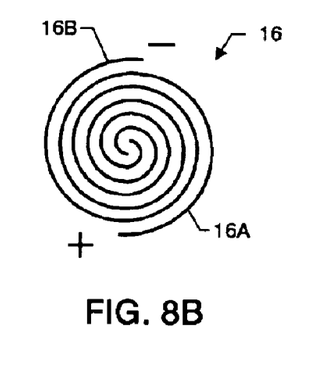
FIG. 8B is an isolated view of a lower electrode pattern using circular intercirculating electrodes.
Figure 8C:
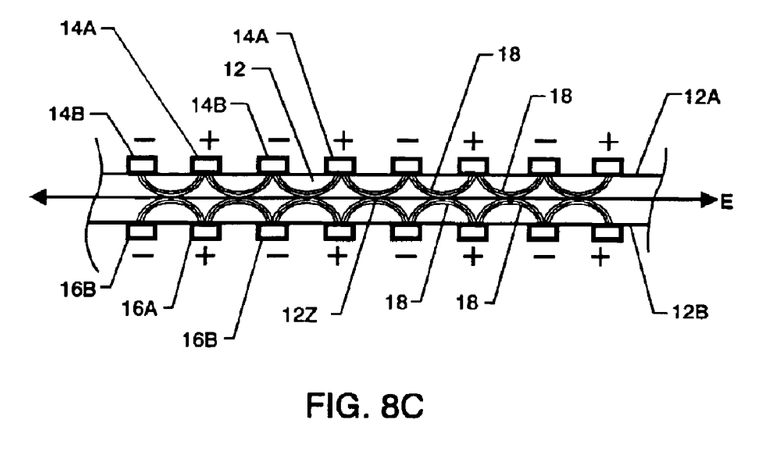
FIG. 8C is a cross-sectional view of a portion of the electro-active transducer having the upper and lower electrode patterns depicted in FIGS. 8A and 8B.
Figures 9A, 9B:
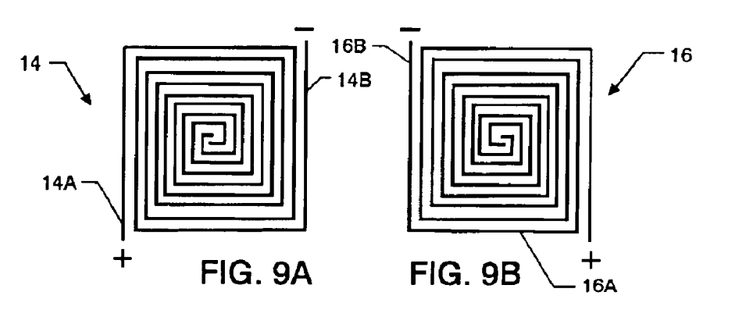
FIG. 9A is an isolated view of an upper electrode pattern using square intercirculating electrodes.
FIG. 9B is an isolated view of a lower electrode pattern using square intercirculating electrodes.
Figure 9C:
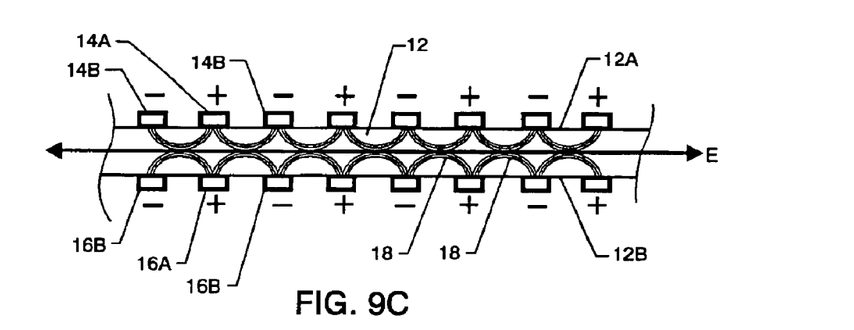
FIG. 9C is a cross-sectional view of a portion of the electro-active transducer having the upper and lower electrode patterns depicted in FIGS. 9A and 9B.

In FIGS. 8A–8C, upper electrode pattern 14 and lower electrode pattern 16 comprise intercirculating electrodes with electrodes 14A and 16A connected to one polarity and electrodes 14B and 16B connected to an opposing polarity. For illustrative purposes, electrodes 14A and 16A have a positive polarity applied thereto and electrodes 14B and 16B have a negative polarity applied thereto.

Patterns 14 and 16 are positioned such that they are a mirror image of one another as illustrated in FIG. 8C. The resulting local electric field lines are indicated by shaped lines 18. In this example, the radial electric field E originates from a very small diameter region 12Z which is similar to the electric field illustrated in FIG. 5.

The spiraling intercirculating electrode pattern need not be based on a circle. For example, the intercirculating electrodes could be based on a square as illustrated on FIGS. 9A–9C. Other geometric intercirculating shapes (e.g., triangles, rectangles, pentagons, etc.) could also be used without departing from the scope of the present invention.

Figure 10A:
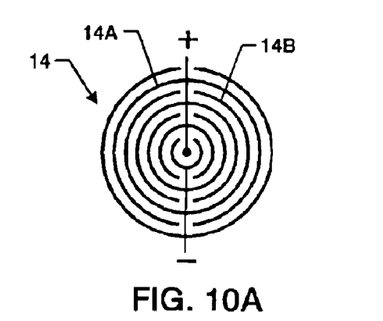
FIG. 10A is an isolated view of an upper electrode pattern using circular interdigitated ring electrodes.
Figure 10B:
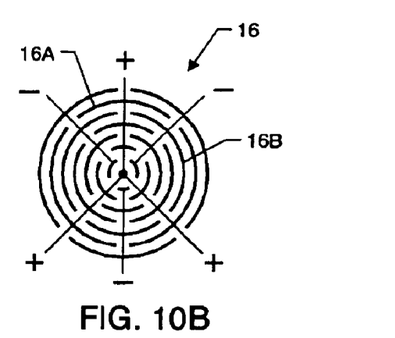
FIG. 10B is an isolated view of an lower electrode pattern using circular interdigitated ring electrodes.
Figure 10C:
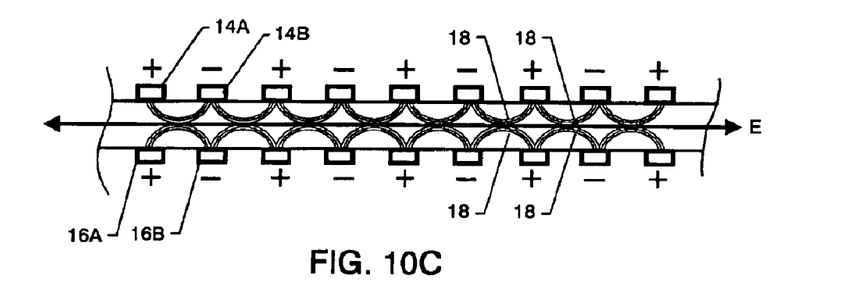
FIG. 10C is a cross-sectional view of a portion of the electro-active transducer having the upper and lower electrode patterns depicted in FIGS. 10A and 10B.
Figure 11A:
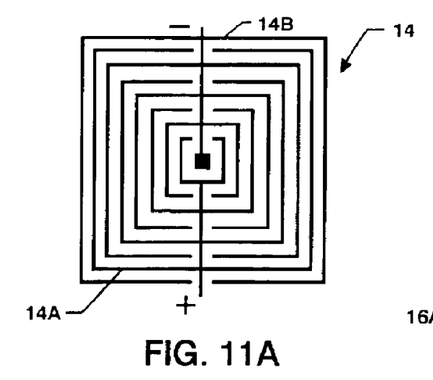
FIG. 11A is an isolated view of an upper electrode pattern using square interdigitated ring electrodes.
Figure 11B:
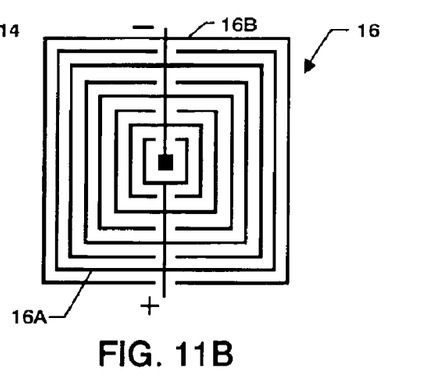
FIG. 11B is an isolated view of a lower electrode pattern using square interdigitated ring electrodes.
Figure 11C:
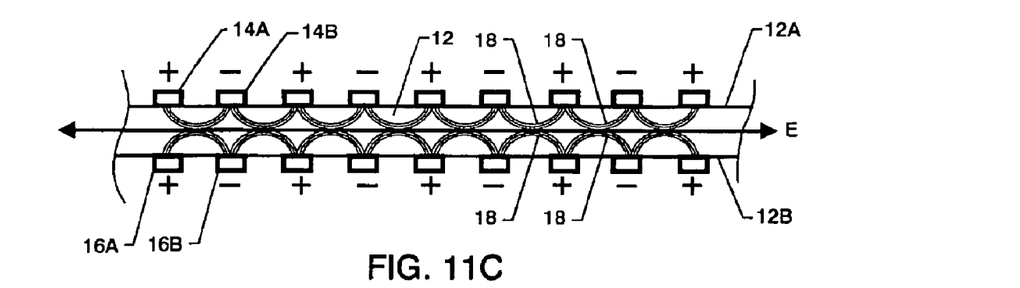
FIG. 11C is a cross-sectional view of a portion of the electro-active transducer having the upper and lower electrode patterns depicted in FIGS. 11A and 11B.

The electrode patterns may also be fabricated as interdigitated rings. For example, FIGS. 10A–10C depict circular-based interdigitated ring electrode patterns where upper and lower electrode patterns 14 and 16 are positioned to be aligned with one another in the Z-axis so that their polarities are aligned as shown in FIG. 10C. Once again, the interdigitated ring electrode patterns could be based on geometric shapes other than a circle. Accordingly, FIGS. 11A–11C depict square-based interdigitated ring electrode patterns as an example of another suitable geometric shape.

Figures 12A, 12B:
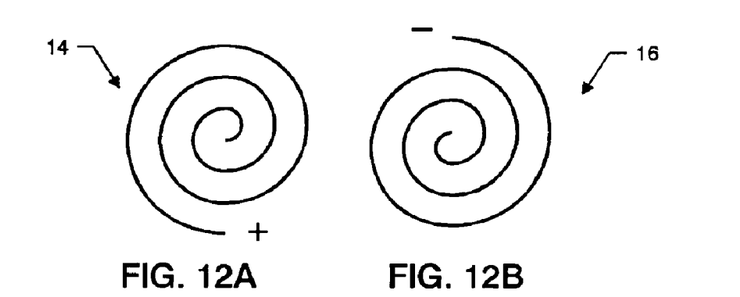
FIG. 12A is an isolated view of an upper electrode pattern using a spiraling electrode.
FIG. 12B is an isolated view of a lower electrode pattern using a spiraling electrode.
Figure 12C:
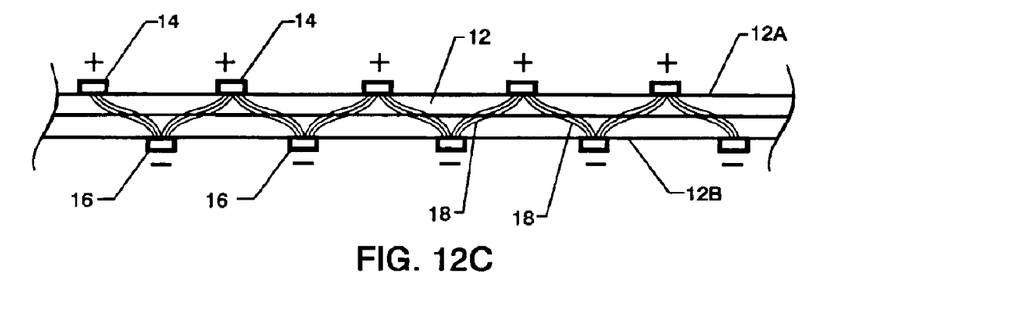
FIG. 12C is a cross-sectional view of a portion of the electro-active transducer having the upper and lower electrode patterns depicted in FIGS. 12A and 12B.
Figure 13A:
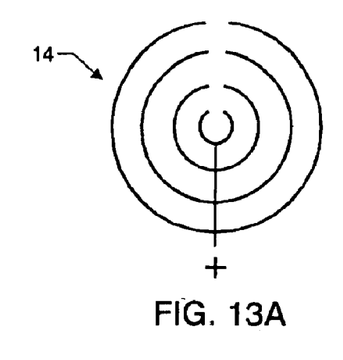
FIG. 13A is an isolated view of an upper electrode pattern using concentric ring electrodes.
Figure 13B:
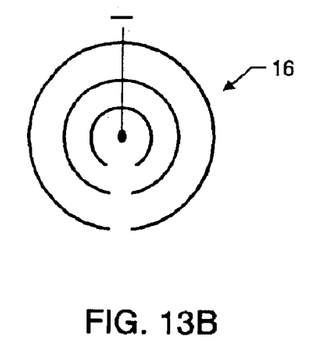
FIG. 13B is an isolated view of a lower electrode pattern using concentric ring electrodes.
Figure 13C:
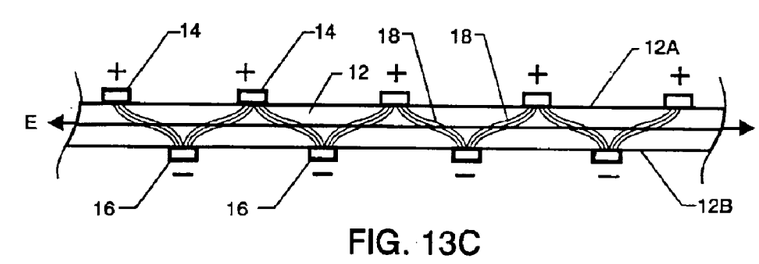
FIG. 13C is a cross-sectional view of a portion of the electro-active transducer having the upper and lower electrode patterns depicted in FIGS. 13A and 13B.

The upper and lower electrode patterns are not limited to mirror image or other aligned patterns. For example, FIGS. 12A–12C depict the use of spiraling electrodes in which upper and lower electrode patterns are staggered with respect to one another when viewed in the cross-section shown in FIG. 12C. Each electrode pattern is defined by a single polarity electrode pattern so that local electric field 18 extends between surfaces 12A and 12B of ferroelectric material 12. Note that the resulting staggered or cross pattern could be achieved by other electrode patterns such as the ring-based electrode patterns illustrated in FIGS. 13A–13C.

For applications requiring greater amounts of out-of-plane displacement D, the electrode patterns can be designed such that the induced radial electric field E enhances the localized strain field of the transducer. In general, this is accomplished by providing an electrode pattern that complements the mechanical strain field of the transducer. One way of accomplishing this result is to provide a shaped piece of electrode material at the central portion of each upper and lower electrode pattern, with the shaped pieces of electrode materials having opposite polarity voltages applied thereto. The local electric field between the shaped electrode materials is perpendicular to the surfaces of the ferroelectric material, while the remainder of the upper and lower electrode patterns are designed so that the radial electric field originates from the aligned edges of the opposing-polarity shaped electrode materials.

Figure 14A:
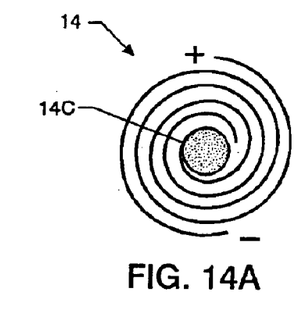
FIG. 14A is an isolated view of another upper electrode pattern based on intercirculating electrodes.
Figure 14B:
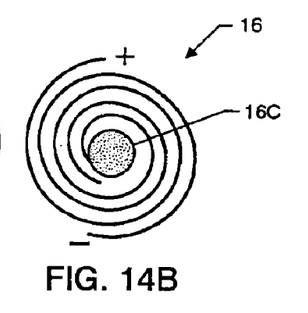
FIG. 14B is an isolated view of another lower electrode pattern based on intercirculating electrodes.
Figure 14C:
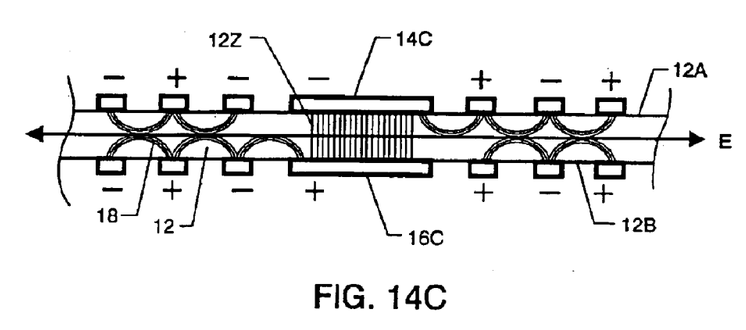
FIG. 14C is a cross-sectional view of a portion of the electro-active transducer having the upper and lower electrode patterns depicted in FIGS. 14A and 14B.

For example, FIGS. 14A–14C depict spiral-based intercirculating electrode patterns in which a shaped negative electrode 14C is aligned over a shaped positive electrode 16C at the center portions of upper electrode pattern 14 and lower electrode pattern 16. Under this embodiment, a circularly shaped region 12Z (aligned with the perimeters of electrodes 14C and 16C) is defined in ferroelectric material 12 with the radial electric field E extending radially outward therefrom. Note that such strain field enhancement is not limited to circularly-shaped electrodes 14C and 16C, as these shapes could be triangular, square, hexagonal, etc. Further, the remaining portions of the electrode patterns could be based on the above-described interdigitated ring or cross-pattern (staggered) electrode patterns.

Figure 15A:
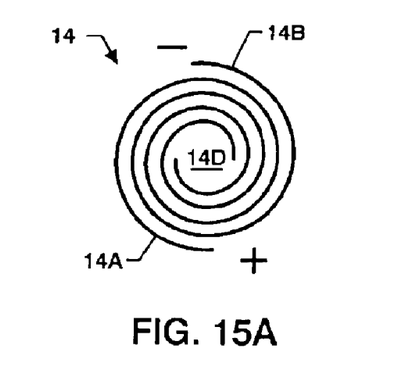
FIG. 15A is an isolated view of another embodiment of an electrode pattern based on intercirculating electrodes.
Figure 15B:
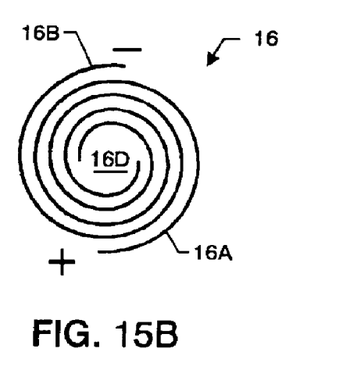
FIG. 15B is an isolated view of another embodiment of an electrode pattern based on intercirculating electrodes.
Figure 15C:
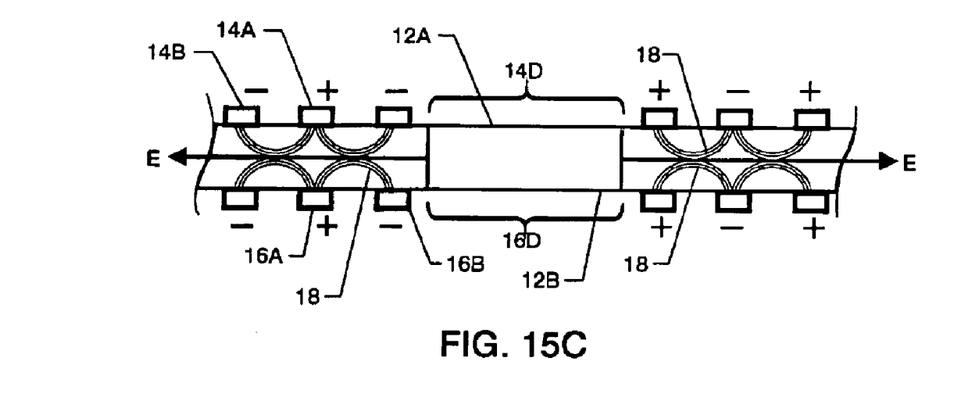
FIG. 15C is a cross-sectional view of a portion of the electro-active transducer having the upper and lower electrode patterns depicted in FIGS. 15A and 15B.

Enhancement of the transducer's local strain field could also be achieved by providing an electrode void or "hole" at the center portion of the electrode pattern so that the radial electric field essentially starts from a periphery defined by the start of the local electric fields. For example, FIGS. 15A–15C depict spiral-based intercirculating electrode patterns that define centrally-positioned upper and lower areas 14D and 16D, respectively, that are void of any electrodes. As a result, the induced radial electric field E originates at the points at which local electric field 18 begins, i.e., about the perimeter of aligned areas 14D and 16D. Once again, the central electrode void areas 14D and 16D are not limited to circular shapes, and the electrode patterns could be based on the above-described interdigitated ring or cross-pattern electrode patterns. Further, ferroelectric material 12 could be eliminated or "punched out" where it is aligned with areas 14D and 16D thereby providing a hole through the transducer assembly 10.

Figure 16:
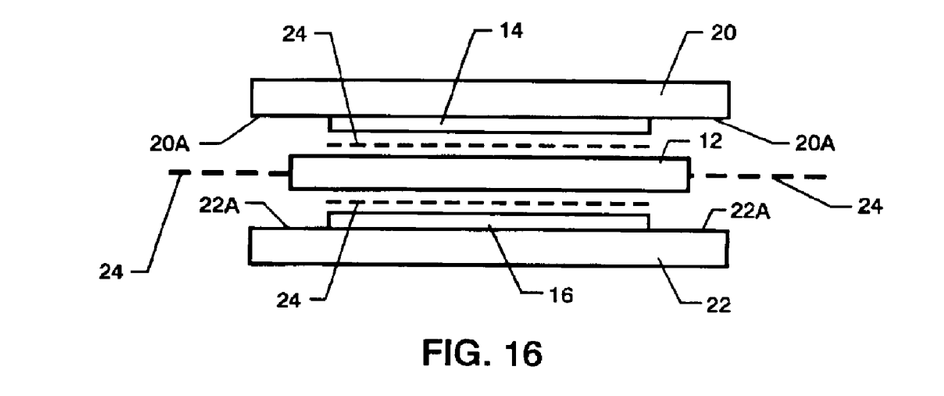
FIG. 16 is an exploded view of an electro-active transducer of the present invention encased in a dielectric material package.
Figure 17:
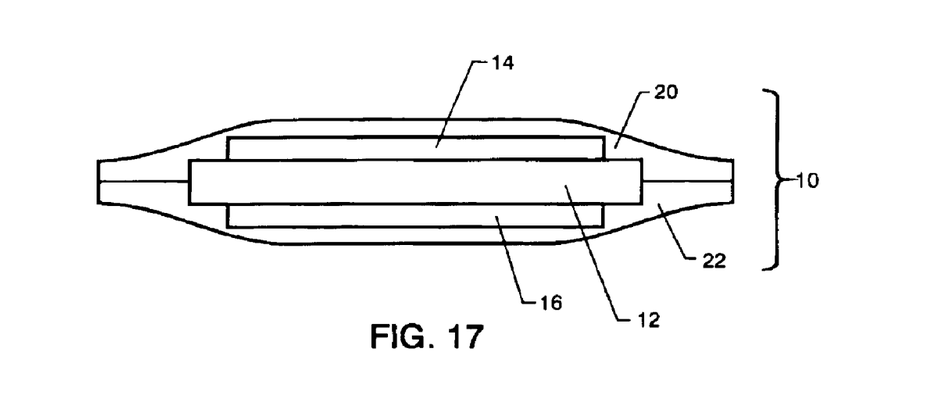
FIG. 17 is a side view of the electro-active transducer of FIG. 16 after construction thereof has been completed.

Regardless of the type of electrode pattern, construction of the electro-active transducer can be accomplished in a variety of ways. For example, the electrode patterns could be applied directly onto the ferroelectric material. Further, the transducer could be encased in a dielectric material to waterproof or otherwise protect the transducer from environmental effects. By way of non-limiting example, one simple and inexpensive construction is shown in an exploded view in FIG. 16. Upper electrode pattern 14 is etched, printed, plated, or otherwise attached to a film 20 of a dielectric material. Lower electrode pattern 16 is similarly attached to a film 22 of the dielectric material. Films 20 and 22 with their respective electrode patterns are coupled to ferroelectric material 12 using a non-conductive adhesive referenced by dashed lines 24. Each of films 20 and 22 should be larger than ferroelectric material 12 so that film portions 20A and 22A that extend beyond the perimeter of ferroelectric material 12 can be joined together using non-conductive adhesive 24. When the structure illustrated in FIG. 16 is pressed together, an environmentally protected electro-active transducer assembly 10 is formed as illustrated in FIG. 17 where the non-conductive adhesive is omitted for clarity of illustration.

Figure 18:
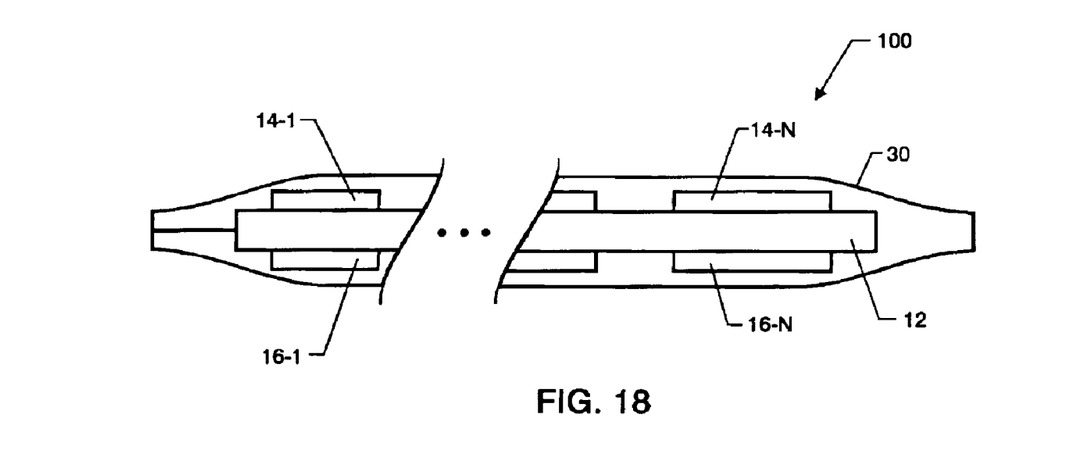
FIG. 18 is a schematic view of an electro-active transducer array according to the present invention.

The present invention is not limited to a single electro-active transducer as has been described thus far. More specifically, the teachings of the present invention can be extended to provide an electro-active transducer assembly array, an example of which is illustrated schematically in FIG. 18 and is referenced generally by numeral 100. Transducer assembly array 100 includes ferroelectric material 12 with a plurality of electrode pattern pairs 14-1/16-1, . . . , 14-N/16-N. Each electrode pattern pair functions as the previously-described electrode pattern pairs defined-by upper electrode pattern 14 and lower electrode pattern 16. Each electrode pattern pair used in transducer assembly array 100 can be the same or could be different. The options for each electrode pattern pair include all of those previously described herein for a single electro-active transducer in accordance with the present invention. Further, as was the case with a single electro-active transducer, the transducer array defined by ferroelectric material 12 and electrode pattern pairs 14-1/16-1, . . . , 14-N/16-N can be encased in a protective dielectric material 30.

The present invention allows individual transducer parameters and functions to be tailored for specific applications. For example, electrode patterns and spacing between electrodes can be varied to adjust electric field intensity, strain vectors, and displacement vectors. Ferroelectric material composition and/or geometry can be varied to adjust electrical and mechanical behavior of the device. The performance parameters of the dielectric encasement and adhesive will affect processing, operational, and durability parameters of the constructed device. The power and frequency of the applied voltages will affect strain, displacement, and power consumption parameters.

The electro-active transducer can be used to generate Z-axis out-of-plane displacement from an X-Y plane induced electric field. The out-of-plane movement is concentric with respect to the radial electric field's point or area of origination. The out-of-plane movement is effected without any mechanical linkage thereby reducing the size and weight of the device. Because the present invention lends itself to thin film fabrication, devices made in accordance with the teachings of the present invention can be incorporated into a wide variety of micro-electronics applications where size is of considerable concern.

The electro-active transducer of the present invention can also be configured to convert Z-axis out-of-plane displacement into an X-Y plane-induced electric field. More specifically, any Z-axis displacement of the ferroelectric material induces/produces a radial electric field therein that, in turn, generates a potential in the upper and lower electrode patterns. The resulting current (or voltage) in the electrode patterns can be measured and is indicative of the amount of Z-axis displacement which, in turn, is indicative of the Z-axis component of the force causing such displacement.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function and step-plus-function clauses are intended to cover the structures or acts described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed as new and desired to be secured by Letters Patent of the United States is:

1. An electro-active transducer, comprising:
   a ferroelectric material defining a first surface and a second surface opposing said first surface, wherein said first surface and said second surface lie in substantially parallel planes;
   a first electrode pattern coupled to said first surface;
   a second electrode pattern coupled to said second surface,
   wherein said first electrode pattern and said second electrode pattern are configured to introduce an electric field into said ferroelectric material when said first electrode pattern and said second electrode pattern have voltage applied thereto, said electric field originating at a region of said ferroelectric material between said first electrode pattern and said second electrode pattern, said electric field extending radially outward from said region of said ferroelectric material and substantially parallel to said first surface and said second surface, whereby said ferroelectric material correspondingly deflects symmetrically about said region in a direction substantially perpendicular to said electric field, and
   wherein said first electrode pattern and said second electrode pattern are configured to produce an induced electric field in said ferroelectric material when said ferroelectric material experiences deflection in a direction substantially perpendicular to said first surface and said second surface, said induced electric field originating at said region of said ferroelectric material between said first electrode pattern and said second electrode pattern, said induced electric field extending radially outward from said region of said ferroelectric material and substantially parallel to said first surface and said second surface, whereby a current induced in each of said first electrode pattern and said second electrode pattern is indicative of said deflection; and,
   a shaped electrode pair, the first piece of said shaped electrode pair being electrically coupled to a center portion of said first electrode pattern, the second piece of said shaped electrode our being electrically coupled to a center portion of said second electrode pattern, wherein each said center portion is aligned with one another to define a common perimeter, wherein voltage applied to said first piece of said shaped electrode pair is an opposite polarity with respect to voltage applied to said second piece of said shaped electrode pair, and wherein said ferroelectric material aligned with said common perimeter defines said region of said ferroelectric material at which said electric field originates.

2. An electro-active transducer as in claim 1 wherein said first electrode pattern and said second electrode pattern are mirror images of one another.

3. An electro-active transducer as in claim 2 wherein each of said first electrode pattern and said second electrode pattern comprises at least two independent electrodes having opposite polarity and arranged in an alternating sequence as they extend radially outward from said region of said ferroelectric material, said alternating sequence being defined with respect to a cross-sectional view of said electro-active transducer.

4. An electro-active transducer as in claim 1 further comprising a dielectric material encasing said ferroelectric material with said first electrode pattern and said second electrode pattern coupled thereto.

5. An electro-active transducer as in claim 1 wherein said ferroelectric material comprises a single sheet of ferroelectric material, and wherein each of said first surface and said second surface is a major surface of said single sheet.

6. An electro-active transducer as in claim 1 further comprising:
a first piece of dielectric material with said first electrode pattern coupled thereto;
a second piece of dielectric material with said second electrode pattern coupled thereto; and
said first piece of dielectric material joined to said second piece of dielectric material beyond the perimeter defined by said ferroelectric material.

7. An electro-active transducer as in claim 1 wherein said ferroelectric material comprises a ceramic piezoelectric material.

8. An electro-active transducer, comprising:
a composite ferroelectric material defining a first surface and a second surface opposing said first surface, wherein said first surface and said second surface lie in substantially parallel planes;
a first electrode pattern coupled to said first surface;
a second electrode pattern coupled to said second surface; and
a dielectric material encasing said ferroelectric material with said first electrode pattern and said second electrode pattern coupled thereto,
wherein said first electrode pattern and said second electrode pattern are configured to introduce an electric field into said ferroelectric material when said first electrode pattern and said second electrode pattern have voltage applied thereto, said electric field originating at a region of said ferroelectric material between said first electrode pattern and said second electrode pattern, said electric field extending radially outward from said region of said ferroelectric material and substantially parallel to said first surface and said second surface, whereby said ferroelectric material correspondingly deflects symmetrically about said region in a direction substantially perpendicular to said electric field, and
wherein said first electrode pattern and said second electrode pattern are configured to produce an induced electric field in said ferroelectric material when said ferroelectric material experiences deflection in a direction substantially perpendicular to said first surface and said second surface, said induced electric field originating at said region of said ferroelectric material between said first electrode pattern and said second electrode pattern, said induced electric field extending radially outward from said region of said ferroelectric material and substantially parallel to said first surface and said second surface, whereby a current induced in each of said first electrode pattern and said second electrode pattern is indicative of said deflection.

9. An electro-active transducer as in claim 8 wherein said first electrode pattern and said second electrode pattern are mirror images of one another.

10. An electro-active transducer as in claim 9 wherein each of said first electrode pattern and said second electrode pattern comprises at least two independent electrodes having opposite polarity and arranged in an alternating sequence as they extend radially outward from said region of said ferroelectric material, said alternating sequence being defined with respect to a cross-sectional view of said electro-active transducer.

11. An electro-active transducer as in claim 8 wherein said first electrode pattern and said second electrode pattern are staggered with respect to one another along a direction substantially perpendicular to said substantially parallel planes, and wherein said first electrode pattern is energized with a voltage of a first polarity and said second electrode pattern is energized with a voltage of a second polarity that is opposite that of said first polarity.

12. An electro-active transducer as in claim 8 further comprising a shaped electrode electrically coupled to a center portion each of said first electrode pattern and said second electrode pattern, wherein each said center portion is aligned with one another to define a common perimeter, wherein voltage applied to said center portion of said first electrode pattern is an opposite polarity with respect to voltage applied to said center portion of said second electrode pattern, and wherein said ferroelectric material aligned with said common perimeter defines said region of said ferroelectric material at which said electric field originates.

13. An electro-active transducer as in claim 8 wherein said ferroelectric material comprises a ceramic piezoelectric material.

14. An electro-active transducer, comprising:
a piece of ferroelectric material defining a first surface and a second surface opposing said first surface, wherein said first surface and said second surface lie in substantially parallel planes;
a first piece of a dielectric material larger than said piece of ferroelectric material;
a second piece of a dielectric material larger than said piece of ferroelectric material;
a first electrode pattern coupled to said first piece of dielectric material;
a second electrode pattern coupled to said second piece of dielectric material;
said first piece of dielectric material with said first electrode pattern coupled thereto end said second piece of dielectric material with said second electrode pattern coupled thereto being sandwiched about said piece of ferroelectric material, wherein said first electrode pattern is coupled to said first surface and said second electrode pattern is coupled to said second surface; and
said first piece of dielectric material being joined to said second piece of dielectric material beyond the perimeter of said piece of ferroelectric material,
wherein said first electrode pattern is aligned with said second electrode pattern to introduce an electric field into said piece of ferroelectric material when said first electrode pattern and said second electrode pattern have voltage applied thereto, said electric field originating at a region of said ferroelectric material between said first electrode pattern and said second electrode pattern, said electric field extending radially outward from said region of said ferroelectric material and substantially parallel to said first surface and said second surface, whereby said ferroelectric material correspondingly deflects symmetrically about said region in a direction substantially perpendicular to said electric field, and wherein said first electrode pattern is aligned with said second electrode pattern to produce an induced electric field in said ferroelectric material when said ferroelectric material experiences deflection in a direction substantially perpendicular to said first surface and said second surface, said induced electric field originating at said region of said ferroelectric material between said first electrode pattern and said second electrode pattern, said induced electric field extending radially outward from said region of said ferroelectric material and substantially parallel to said first surface and said second surface, whereby a current induced in each of said first electrode pattern and said second electrode pattern is indicative of said deflection.

15. An electro-active transducer as in claim 14 wherein said first electrode pattern and said second electrode pattern are mirror images of one another.

16. An electro-active transducer as in claim 15 wherein each of said first electrode pattern and said second electrode pattern comprises at least two independent electrodes having opposite polarity and arranged in an alternating sequence as they extend radially outward from said region of said ferroelectric material, said alternating sequence being defined with respect to a cross-sectional view of said electro-active transducer.

17. An electro-active transducer as in claim 14 wherein said first electrode pattern and said second electrode pattern are staggered with respect to one another along a direction substantially perpendicular to said substantially parallel planes, and wherein said first electrode pattern is energized with a voltage of a first polarity and said second electrode pattern is energized with a voltage of a second polarity that is opposite that of said first polarity.

18. An electro-active transducer as in claim 14 further comprising a shaped electrode electrically coupled to a center portion each of said first electrode pattern and said second electrode pattern, wherein each said center portion is aligned with one another to define a common perimeter, wherein voltage applied to said center portion of said first electrode pattern is an opposite polarity with respect to voltage applied to said center portion of said second electrode pattern, and wherein said ferroelectric material aligned with said common perimeter defines said region of said ferroelectric material at which said electric field originates.

19. An electro-active transducer as in claim 14 wherein said ferroelectric material comprises a ceramic piezoelectric material.

20. An electro-active transducer as in claim 14 further comprising an electrically non-conductive adhesive between i) said first piece of dielectric material and said piece of ferroelectric material, ii) said second piece of dielectric material and said piece of ferroelectric material, and iii) portions of said first piece of dielectric material and portions of said second piece of dielectric material that lie beyond the perimeter of said piece of ferroelectric material.

21. An electro-active transducer array comprising:
a ferroelectric material defining a first surface and a second surface opposing said first surface, wherein said first surface and said second surface lie in substantially parallel planes;
a plurality of first electrode patterns coupled to said first surface;
a plurality of second electrode patterns coupled to said second surface; and
a dielectric material encasing said ferroelectric material with said plurality of first electrode patterns and said plurality of second electrode patterns coupled thereto;
each of said plurality of first electrode patterns being aligned with a corresponding one of said plurality of second electrode patterns to define an electrode pattern pair,
wherein each said electrode pattern pair introduces an electric field into said ferroelectric material when voltage is applied thereto, said electric field originating at a region of said ferroelectric material between said electrode pattern pair, said electric field extending radially outward from said region of said ferroelectric material and substantially parallel to said first surface and said second surface, whereby said ferroelectric material deflects symmetrically about said region in a direction substantially perpendicular to said electric field, and
wherein each said electrode pattern pair produces an induced electric field in said ferroelectric material when said ferroelectric material therebetween experiences deflection in a direction substantially perpendicular to said first surface and said second surface, said induced electric field originating at said region of said ferroelectric material of a corresponding said electrode pattern pair, said induced electric field extending radially outward from said region of said ferroelectric material and substantially parallel to said first surface and said second surface, whereby a current induced in each said electrode pattern pair is indicative of said deflection.

22. An electro-active transducer array as in claim 21 wherein said first electrode pattern and said second electrode pattern associated with at least one said electrode pattern pair are miror images of one another.

23. An electro-active transducer as in claim 22 wherein each of said first electrode pattern and said second electrode pattern associated with at least one said electrode pattern pair comprises at least two independent electrodes having opposite polarity and arranged in an alternating sequence as they extend radially outward from said region of said ferroelectric material, said alternating sequence being defined with respect to a cross-sectional view of said electro-active transducer.

24. An electro-active transducer as in claim 21 wherein said first electrode pattern and said second electrode pattern associated with at least one said electrode pattern pair are staggered with respect to one another along a direction substantially perpendicular to said substantially parallel planes, and wherein said first electrode pattern is energized with a voltage of a first polarity and said second electrode pattern is energized with a voltage of a second polarity that is opposite that of said first polarity.

25. An electro-active transducer as in claim 21 further comprising a shaped electrode electrically coupled to a center portion each of said first electrode pattern and said second electrode pattern associated with at least one said electrode pattern pair, wherein each said center portion is aligned with one another to define a common perimeter, wherein voltage applied to said center portion of said first electrode pattern is an opposite polarity with respect to voltage applied to said center portion of said second electrode pattern, and wherein said ferroelectric material aligned with said common perimeter defines said region of said ferroelectric material at which said electric field originates.

26. An electro-active transducer as in claim 21 wherein said ferroelectric material comprises a ceramic piezoelectric material.

27. An electro-active actuator, comprising:
- a ferroelectric material defining a first surface and a second surface opposing said first surface, wherein said first surface and said second surface lie in substantially parallel planes;
- a first electrode pattern coupled to said first surface;
- a second electrode pattern coupled to said second surface; and
- a dielectric material encasing said ferroelectric material with said first electrode pattern and said second electrode pattern coupled thereto,
- wherein said first electrode pattern and said second electrode pattern are configured to introduce an electric field into said ferroelectric material when said first electrode pattern and said second electrode pattern have voltage applied thereto, said electric field originating at a region of said ferroelectric material between said first electrode pattern and said second electrode pattern, said electric field extending radially outward from said region of said ferroelectric material and substantially parallel to said first surface and said second surface, whereby said ferroelectric material correspondingly deflects symmetrically about said region in a direction substantially perpendicular to said electric field.

28. An electro-active actuator as in claim 27 wherein said first electrode pattern and said second electrode pattern are mirror images of one another.

29. An electro-active actuator as in claim 28 wherein each of said first electrode pattern and said second pattern comprises at least two independent electrodes having opposite polarity and arranged in an alternating sequence as they extend radially outward from said region of said ferroelectric material, said alternating sequence being defined with respect to a cross-sectional view of said electro-active actuator.

30. An electro-active actuator as in claim 27 wherein said first electrode pattern and said second electrode pattern are staggered with respect to one another along a direction substantially perpendicular to said substantially parallel planes, and wherein said first electrode pattern is energized with a voltage of a first polarity and said second electrode pattern is energized with a voltage of a second polarity that is opposite that of said first polarity.

31. An electro-active actuator as in claim 27 further comprising a shaped electrode electrically coupled to a center portion each of said first electrode pattern and said second electrode pattern, wherein each said center portion is aligned with one another to define a common perimeter, wherein voltage applied to said center portion of said first electrode pattern is an opposite polarity with respect to voltage applied to said center portion of said second electrode pattern, and wherein said ferroelectric material aligned with said common perimeter defines said region of said ferroelectric material at which said electric field originates.

32. An electro-active actuator as in claim 27 wherein said ferroelectric material comprises a single sheet of ferroelectric material, and wherein each of said first surface and said second surface is a major surface of said single sheet.

33. An electro-active actuator as in claim 27 wherein said dielectric material comprises
- a first piece of dielectric material with said first electrode pattern coupled thereto and
- a second piece of dielectric material with said second electrode pattern coupled thereto,
- said first piece of dielectric material being joined to said second piece of dielectric material beyond the perimeter defined by said ferroelectric material.

34. An electro-active actuator as in claim 27 wherein said ferroelectric material comprises a ceramic piezoelectric material.

* * * * *

UNITED STATES PATENT AND TRADEMARK OFFICE
CERTIFICATE OF CORRECTION

| | | |
|---|---|---|
| PATENT NO. | : 7,038,358 B2 | Page 1 of 1 |
| APPLICATION NO. | : 10/347563 | |
| DATED | : May 2, 2006 | |
| INVENTOR(S) | : Robert G. Bryant et al. | |

It is certified that error appears in the above-identified patent and that said Letters Patent is hereby corrected as shown below:

Col. 8, line 55
  replace "of said shaped electrode our being electrically coupled"
  with --of said shaped electrode being electrically coupled--.

Signed and Sealed this

Twelfth Day of December, 2006

JON W. DUDAS
*Director of the United States Patent and Trademark Office*